United States Patent [19]

Numata et al.

[11] Patent Number: 4,759,958

[45] Date of Patent: Jul. 26, 1988

[54] METHOD FOR FORMING POLYIMIDE FILM BY CHEMICAL VAPOR DEPOSITION

[75] Inventors: Shunichi Numata, Hitachi; Ikeda Takayoshi, Toukai; Koji Fujisaki, Hitachi; Takao Miwa, Hitachi; Noriyuki Kinjo, Hitachi, all of Japan

[73] Assignee: Hitachi, Ltd., Tokyo, Japan

[21] Appl. No.: 76,764

[22] Filed: Jul. 23, 1987

[30] Foreign Application Priority Data

Jul. 30, 1986 [JP] Japan ............................. 61-177509

[51] Int. Cl.$^4$ ................................................ C23C 16/00
[52] U.S. Cl. .................................. 427/255.6; 427/255; 427/385.5
[58] Field of Search .................... 427/255.6, 255, 164, 427/385.5

[56] References Cited

U.S. PATENT DOCUMENTS

| | | | |
|---|---|---|---|
| 4,104,438 | 8/1978 | Angelo et al. | 427/255.6 |
| 4,180,614 | 12/1979 | Angelo et al. | 427/255.6 |
| 4,624,867 | 11/1986 | Iijima et al. | 427/255.6 |

Primary Examiner—Sadie L. Childs
Attorney, Agent, or Firm—Antonelli, Terry & Wands

[57] ABSTRACT

A method for forming a polyimide film on a substrate surface by chemical vapor deposition comprises evaporating an aromatic monomer compound having one amino group and two adjacent carboxyl groups or its derivative group, such as esters of 4-amino phthalic acid, and 4-(p-anilino) phthalic acid, thus a high strength polyimide is obtained represented by the general formula having its imide groups being unidirectionally arranged in its backbone chain:

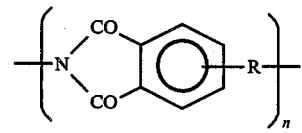

wherein R is nil or divalent aliphatic or aromatic group and n is an integer.

7 Claims, 1 Drawing Sheet

METHOD FOR FORMING POLYIMIDE FILM BY CHEMICAL VAPOR DEPOSITION

BACKGROUND OF THE INVENTION

The present invention relates to a method for forming a polyimide film by chemical vapor deposition. The resultant polyimide film is useful as an insulating, passivating or moistureproof protective film of a semiconductor element, or an orientation control film of a liquid crystal display element.

A known process for preparing a polyimide film, a so-called wet process comprises polymerizing a diamino compound with a tetracarboxylic acid or its derivative in an organic polar solvent to prepare a polyamidc acid varnish, applying the varnish on a substrate and heating the varnish to dry and to convert into polyimide. This process tends to give a thin film having pinholes, so that the preparation of a high quality film is difficult. This tendency is particularly marked, when a thin film having a thickness of lower than 1 $\mu$m is prepared. Further, the process has another disadvantage in that the obtained film tends to include impurities due to the solvent used.

U.S. Pat. No. 4,625,867 discloses a process for preparing a polyimide film which comprises simultaneously evaporating two monomers for a polyimide such as pyromellitic acid dianhydride and 4,4'-diaminodiphenyl ether with a suitable mol ratio to deposit them on a substrate and polymerizing them thereon by heating for overcoming the above disadvantages of the wet process. This process requires continuous measurement of the temperature of the monomers during the heating and thereby controlling it exactly in order to prepare a uniform and high strength film, because an exact control of the evaporation rate of each of the monomers is needed to obtain a high molecular weight polyimide which can give a uniform and high strength film. However, the exact control of the temperature, in other words, the evaporation rate of the two monomers is very difficult in the process, so that the preparation of a high molecular weight polyimide film is very difficult. More precisely, if the molar ratio of the monomers to be reacted is deviated from its stoichiometric value only by 10%, the obtained polyimide film will have a remarkably low molecular weight. For example, when a diamine is reacted with a tetracarboxylic anhydride with an exact molar ratio of 1:1, the resultant polyimide has a molecular weight of 20,000 to 50,000, while when a diamine is reacted with a tetracarboxylic anhydride with a molar ratio of 10:9 or 9:10, the resultant polyimide has a molecular weight of about 3800 at the most.

As reported, for example, in M. L. WALLACH "Structure-Property Relations of Polyimide Films" (JOURNAL OF POLYMER SCIENCE: PART A-2, VOL. 6, 953-960, (1968)), it is well known that the strength of a polyimide film lowers with lowering molecular weight thereof.

SUMMARY OF THE INVENTION

One object of the present invention is to provide a method for forming a polyimide film having a high strength by chemical vapor deposition.

Another object of the present is to provide a method for forming a polyimide film having a high strength by chemical vapor deposition which eliminates the necessity of precise evaporation rate control of respective monomers.

A method for forming a polyimide film of the present invention comprises evaporating under vacuum an aromatic monomer compound having one amino group and two adjacent carboxyl groups or its derivatives such as monoester, diesters, chlorides and anhydrides, depositing the evaporated aromatic monomer compound on a substrate surface and polymerizing the deposited aromatic monomer compound into polyimide, said polyimide is represented by the general formula having its imide groups being unidirectionally arranged in its backbone chain:

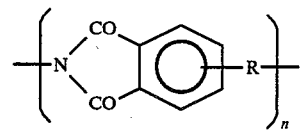

wherein R is nil or a divalent aliphatic or aromatic group and n is an integer.

Since the aromatic monomer compounds having in one molecule one amino group and two adjacent carboxyl groups or derived groups therefrom, in other words, dicarboxylic acids having one amino group or its derivatives, are used for the present invention, the equivalent ratio of the amino group to the carboxyl group or its derivative group is always and exactly kept at 1:2 so that the resultant polyimide does not undergo lowering in molecular weight, because no deviation of the equivalent ratio from its stoichiometric value occurs unlike the conventional method.

Heating of the deposited monomer on the substrate surface for polymerization is carried out either by depositing the monomer on the substrate which has been heated to a given temperature or by depositing it on the substrate at a room temperature and heating it to a given temperature. The monomer is preferably heated to a temperature of 200° to 450° C.

The starting material to be used in the present invention may be any aromatic monomer compounds having one amino group and two adjacent carboxyl groups or any derivative thereof. Two or more members selected from among such aromatic monomer compounds may be simultaneously evaporated, deposited on a substrate and copolymerized thereon. Even in this case, the equivalent ratio of the amino group to the carboxyl group or groups derived therefrom is always and exactly kept at 1:2, so that the obtained polyimide does not undergo lowering in molecular weight due to deviation of the equivalent ratio from its stoichiometric value.

The aromatic monomer compound having one amino group and two adjacent carboxyl groups or its derivative to be used in the present invention is represented by the general formula:

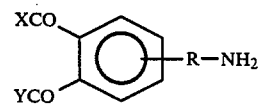

wherein X and Y are a hydroxyl or alkoxyl group or a halogen atom or an anhydride (X+Y) and may be the same or different and R is $-C_pH_{2p}-$ (p is a positive integer),

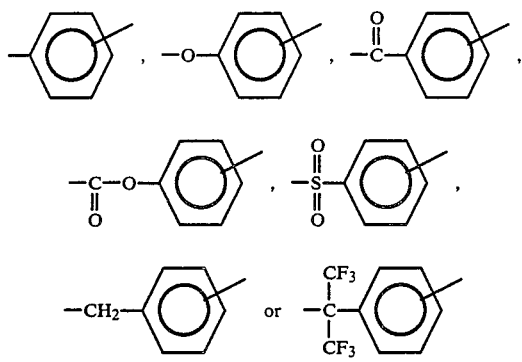

Examples thereof will be described. Although the following examples are all those of free carboxylic acid type aromatic monomer compounds having one amino group, monoesters, diesters, chlorides and anhydrides thereof are also used in the present invention:

4-aminophthalic acid, 4-aminomethylphthalic acid, 4-(m-anilino)phthalic acid, 4-(p-anilino)phthalic acid, 3-(m-anilino)phthalic acid, 3-(p-anilino)phthalic acid, 4-(3-aminophenoxy)phthalic acid, 4-(4-aminophenoxy)phthalic acid, 3-amino-3',4'-dicarboxybenzophenone, 4-amino-3',4'dicarboxybenzophenone, 3-anilino ester of trimellitic acid, 4-anilino ester of trimellitic acid, 4-anilino amide of trimellitic acid, 3-amino-3',4'-dicarboxydiphenyl sulfone, 4-amino-3',4'-dicarboxydiphenyl sulfone, 4-(4-aminobenzyl)phthalic acid and 2-(p-anilino)-2-(3,4-dicarboxylphenyl)hexafluoropropane.

From the standpoint of the stability of functional groups of the monomers, aromatic monomer compounds having esterified derivative of carboxyl groups are preferable.

It is desirable that the molecular weight of the aromatic monomer compounds to be used in the present invention is as low as possible. The lower the molecular weight of the monomer, the higher the vapor pressure thereof and therefore the higher the evaporation rate thereof at a given temperature under a given reduced pressure. If the temperature of a monomer evaporating cell is too high, the monomer will be polymerized in the cell to lower the evaporation efficiency.

Further the esters and anhydrides of the carboxylic acids is more preferable than the free carboxylic acids, because of their easy evaporation due to the their small cohesive energy density.

Still further the free carboxylic acids and the monoesters thereof deposited on a none-heated substrate is rendered to anhydrides thereof.

When 4-aminophthalic, 4-(p-anilino)phthalic acid, or their derivatives is used as a monomer in the present invention, the polyimide film formed on a substrate exhibits low thermal expansion, high elastic modulus, low hygroscopicity, low moisture-permeability and the like, thus being extremely useful. Further, two or more monomers selected from among those as defined above may be simultaneously evaporated and deposited to thereby control the physical properties of the resulting polyimide film, such as coefficient of thermal expansion or elastic modulus. Even in this case, the equivalent ratio of the amino group to the carboxyl group or a group derived therefrom is always kept at 1:2, so that no stoichiometry problem occurs, unlike the conventional process disclosed in U.S. Pat. No. 4,624,867.

According to the present invention, it is further preferable in order to enhance the adhesion of a polyimide film to a substrate that the substrate is treated prior to the deposition by subjecting it to coupling treatment, forming a well adhesive thin film made of carbon, alumina, metal or the like on the substrate or roughening the surface of the substrate by wet or dry etching.

According to the process of the present invention, a polyimide film is prepared by evaporating an aromatic monomer compound having one amino group and two adjacent carboxyl groups or its derivative group to make it deposited on a substrate. Therefore, the equivalent ratio of the amino group to the carboxyl group is exactly kept at 1:2 unlike the conventional process, thus being free from lowering in the molecular weight of the obtained polyimide resulting from deviation of the equivalent ratio from its stoichiometric value.

BRIEF DESCRIPTION OF THE DRAWING

FIGURE shows a sectional view of an apparatus for preparing a polyimide film by chemical vapor deposition according to the present invention.

EXAMPLES OF THE INVENTION

Example 1

Figure 1:
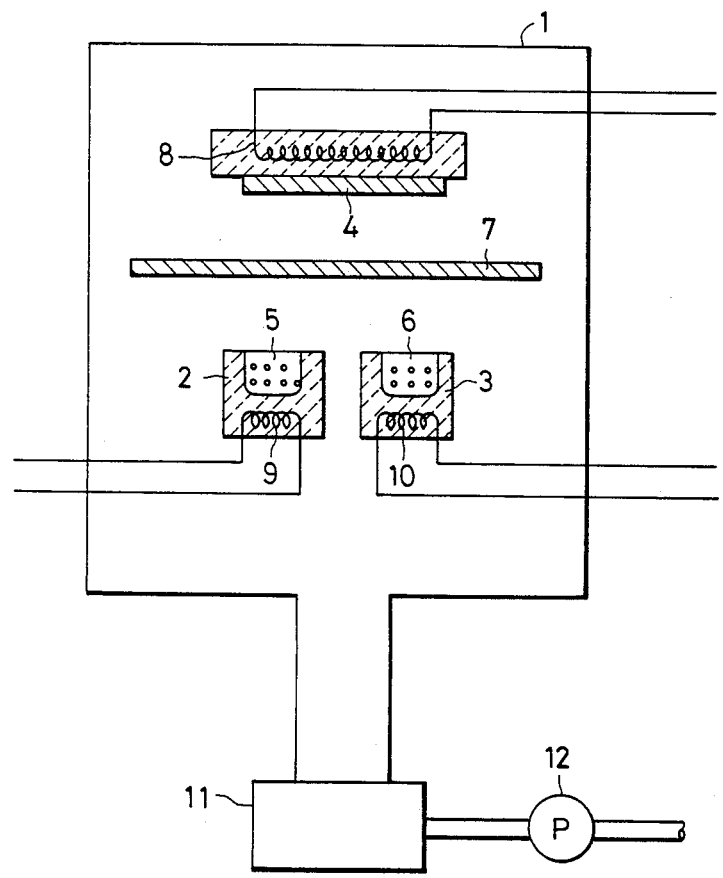

An example of the present invention will now be described by referring to FIG. 1.

FIG. 1 shows an example of the apparatus for carrying out the present invention. Numeral 1 refers to a vacuum chamber, and a vacuum pump 12 and an oil diffusion pump 11 are connected to the chamber 1 as a system for evacuating the chamber 1. A substrate 4 is heated with a heater 8 to a temperature of 100° to 450° C. Monomers 5 and 6 are put in heater fitted monomer cells 2 and 3, respectively. Numeral 7 refers to a shutter.

4-aminophthalic acid monomethyl ester was put in the monomer cell 2. A Si wafer 4 which had been coated with an aluminium Al kylate solution and cured at 350° C. for 30 minutes was set into the vacuum chamber. The vacuum chamber 1 was adjusted to $1 \times 10^{-6}$ Torr. The monomer cell 2 was heated up gradually. The temperature of the monomer was increased to initiate the evaporation thereof. At this point of time, the shutter 7 was opened to deposit the monomer on the substrate 4. After completing the deposition, infrared absorption spectrums of the deposit on the substrate 4 and the residue in the monomer cell 2 were examined and determined that the deposit and the residue were to be anhydride of 4-aminophthalic acid and polyimide respectively.

The substrate was heated up to 400° C. over a period of one hour under normal pressure and in nitrogen gas, kept at this temperature for 30 minutes and cooled to a room temperature. The film thus formed on the substrate was also polyimide. The outlook of the polyimide film was good.

Example 2

4-(p-aminophenoxy)phthalic acid dimethyl ester was put in the monomer cell 3 as another monomer. The vacuum chamber was evacuated similarly to the case of Example 1. The monomer cell 2 was heated to 140° C., while the monomer cell 3 was heated to 105° C. Thus, the two monomers were simultaneously evaporated. The shutter 7 was opened, kept open for 60 minutes and closed and the heating of the monomer cells 2 and 3 was stopped. After the pressure of the vacuum chamber was returned to normal, the substrate was heated to 400° C., kept at the temperature for 10 minutes and gradually cooled to a room temperature.

A polyimide film having a thickness of about 1.7 μm was formed on the substrate. This film was torn off with a knife and thereby confirmed to be very tough.

Example 3

4-(p-anilino) phthalic acid dimethyl ester was put in the monomer cell 2. A Si wafer 4 which had been treated as explained in Example 1 was set into the vacuum chamber 1. After the pressure of the vacuum chamber was reduced to $1 \times 10^{-6}$ Torr, the substrate 4 was heated upto 350° C. and the monomer was deposited onto the substrate in substantially the same manner as in Example 1 by heating the monomer cell 2. The resultant film fomed on the substrate was determined to be polyimide through its infrared absorption spectrum.

Example 4

4-(p-anilino) phthalic acid was put in the monomer cell 2. A Si wafer treated as in Example 1 was set in the vacuum chamber 1. After the pressure of the vacuum chamber was reduced to $1 \times 10^{-6}$ Torry, the substrate was kept at a room temperature and the monomer was deposited onto the substrate in substantially the same manner as in Example 1 by heating the monomer cell 2. After returning the vacuum chamber pressure to normal one, the substrate and the monomer cell were taken out. The substantial part of the monomer was converted into polyimide in the monomer cell 2 and a slight part of the monomer was deposited on the substrate. This is because 4-(p-anilino) phthalic acid is hard to evaporated compared with 4-aminophthalic acid and diester of 4-(p-anilino) phthalic acid, since the molecular weigth of 4-(p-anilino) phthalic acid is larger than that of 4-amino phthalic acid the cohesive energy density thereof is larger than that of the diester. The deposite was determined to be anhydride of 4-(p-anilino) phthalic acid through its infrared absorption spectrum and the deposit was converted into polyimide by heating.

Accordingly, the obtained film is extremely useful as a thin film to be used in electronics components, for example, orientation control film for a liquid crystal display element, passivating film of LS1, interlayer insulating film of a multi-layered circuit board, or protective film of a magnetic or optical disc.

According to the present invention, a uniform, pinhole free and high strength thin polyimide film is prepared.

We claim:

1. A method for forming a polyimide film on a substrate surface by chemical vapor deposition comprising:
    a step of evaporating under vacuum at least one aromatic monomer compound having one amino group and two adjacent carboxyl groups or its derivative group;
    a step of depositing the evaporated aromatic monomer compound on the substrate surface; and
    a step of polymerizing the deposited aromatic monomer compound into polyimide which is represented by the general formula having its imide groups being unidirectionally arranged in its backbone chain:

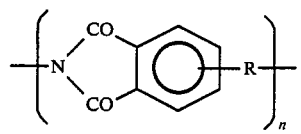

wherein R is nil or divalent aliphatic or aromatic group and n is an integer.

2. The method for forming a polyimide film on a substrate surface by chemical vapor deposition according to claim 1 wherein the aromatic monomer compound having one amino group and two adjacent carboxyl groups or its derivative group is represented by the general formula:

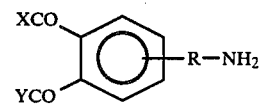

wherein X and Y are a hydroxyl or alkoxyl group or a halogen atom or an anhydride (X+Y) and may be the same or different and R is —$C_pH_{2p}$— (p is a positive integer),

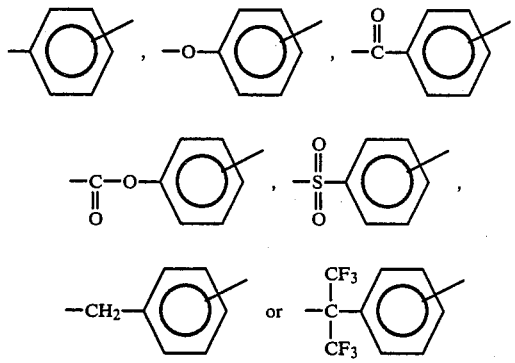

3. The method for forming a polyimide film on a substrate surface by chemical vapor deposition according to claim 3 wherein the aromatic monomer compound having one amino group and two adjacent carboxyl groups or its derivative group is selected from the group consisting of free carboxylic acid type aromatic monomer compounds having one amino group and monoesters, diesters, chlorides and anhydrides thereof.

4. The method for forming a polyimide film on a substrate surface by chemical vapor deposition according to claim 3 wherein the aromatic monomer compound having one amino group and two adjacent carboxyl groups or its derivative group is selected from the group consisting of 4-aminophthalic acid, 4-aminomethylphthalic acid, 4-(m-anilino)phthalic acid, 4-(p-anilino)phthalic acid, 3-(m-anilino)phthalic acid, 3-(p-anilino)phthalic acid, 4-(3-aminophenoxy)phthalic acid, 4-(4-aminophenoxy)phthalic acid, 3-amino-3',4'-dicarboxybenzophenone, 4-amino-3',4'dicarboxybenzophenone, 3-anilino ester of trimellitic acid, 4-anilino ester of trimellitic acid, 4-anilino amide of trimellitic acid, 3-amino-3',4'-dicarboxydiphenyl sulfone, 4-amino-3',4'-dicarboxydiphenyl sulfone, 4-(4-aminobenzyl) phthalic acid, 2-(p-anilino)-2-(3,4-dicarboxylphenyl)-hexafluoropropane, and monoesters, diesters, chlorides and anhydrides thereof.

5. The method for forming a polyimide film on a substrate surface by chemical vapor deposition according to claim 1 wherein the aromatic monomer compound having one amino group and two adjacent carboxyl groups or its derivative group is selected from the group consisting of 4-aminophthalic acid, 4-(p-anilino)phthalic acid and their derivatives.

6. The method for forming a polyimide film on a substrate surface by chemical vapor deposition according to claim 1 wherein the aromatic monomer compound having one amino group and two adjacent carboxyl groups or its derivative group is selected from the group consisting of esters of 4-aminophthalic acid, and 4-(p-anilino)phthalic acid.

7. The method for forming a polyimide film on a substrate surface by chemical vapor deposition according to claim 1 wherein at least two different aromatic monomer compounds each having one amino group and two adjacent carboxyl groups or its derivative group are simultaneously evaporated in said evaporating step.

* * * * *